United States Patent
Koga

(10) Patent No.: US 7,245,503 B2
(45) Date of Patent: Jul. 17, 2007

(54) CIRCUIT BOARD HAVING SIGNAL LINES ADAPTED TO TRANSMIT HIGH SPEED SIGNALS

(75) Inventor: Yuuichi Koga, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 11/288,127

(22) Filed: Nov. 29, 2005

(65) Prior Publication Data

US 2006/0113109 A1   Jun. 1, 2006

(30) Foreign Application Priority Data

Nov. 30, 2004   (JP)   ............................. 2004-347157

(51) Int. Cl.
   *H05K 7/00*   (2006.01)
(52) U.S. Cl. ...................................... 361/760; 174/254
(58) Field of Classification Search ................ 174/254; 361/749, 760; 349/50–51
   See application file for complete search history.

(56) References Cited

U.S. PATENT DOCUMENTS

2004/0080386 A1   4/2004   Kitamura et al. ........... 333/246

FOREIGN PATENT DOCUMENTS

JP   05-265023   10/1993
JP   2003-216064   7/2003

*Primary Examiner*—Javaid H. Nasri
(74) *Attorney, Agent, or Firm*—Pillsbury Winthrop Shaw Pittman, LLP

(57) ABSTRACT

To provide a circuit board comprising a plurality of first signal lines which transmits first signals, a plurality of second signal lines which transmits second signals which are higher in speed than the first signals, a joint which is bonded to a joint of another circuit board through an anisotropic conductive material, a plurality of first electrodes which are arranged at regular intervals separated by a first distance in the joint, each of the first electrodes are connected to a respective one of the first signal lines, and a plurality of second electrodes which are arranged at regular intervals separated by a second distance larger than the first distance in the joint, each of the second electrodes are connected to a respective one of the second signal lines.

11 Claims, 4 Drawing Sheets

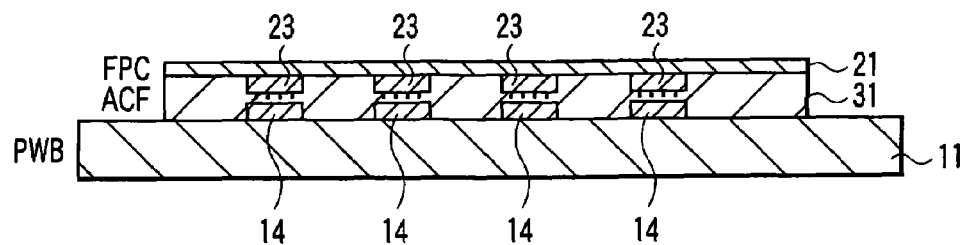
F I G. 4
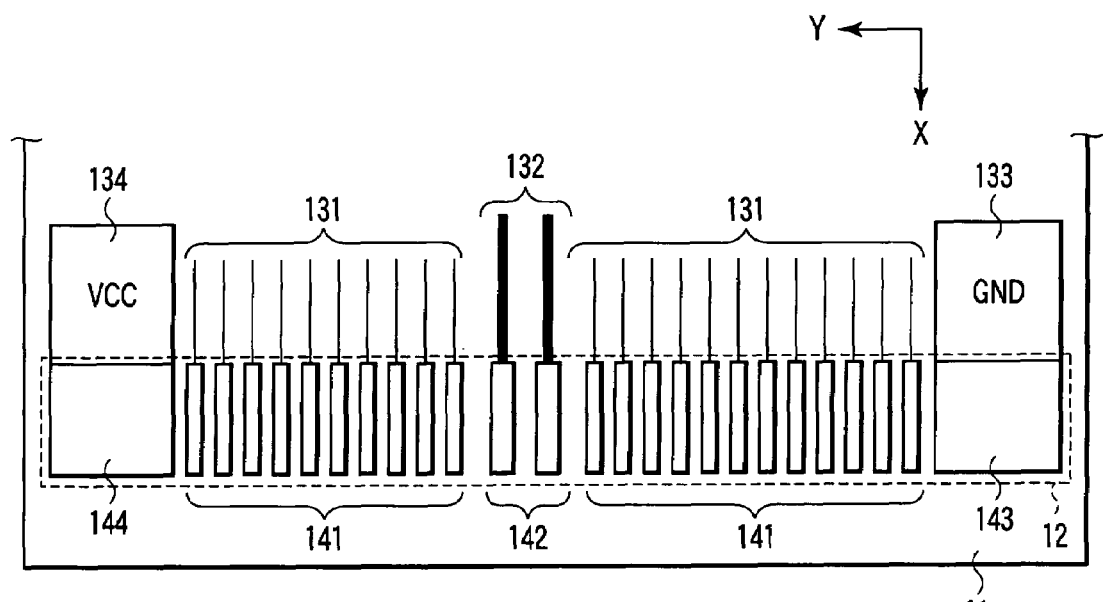
F I G. 5
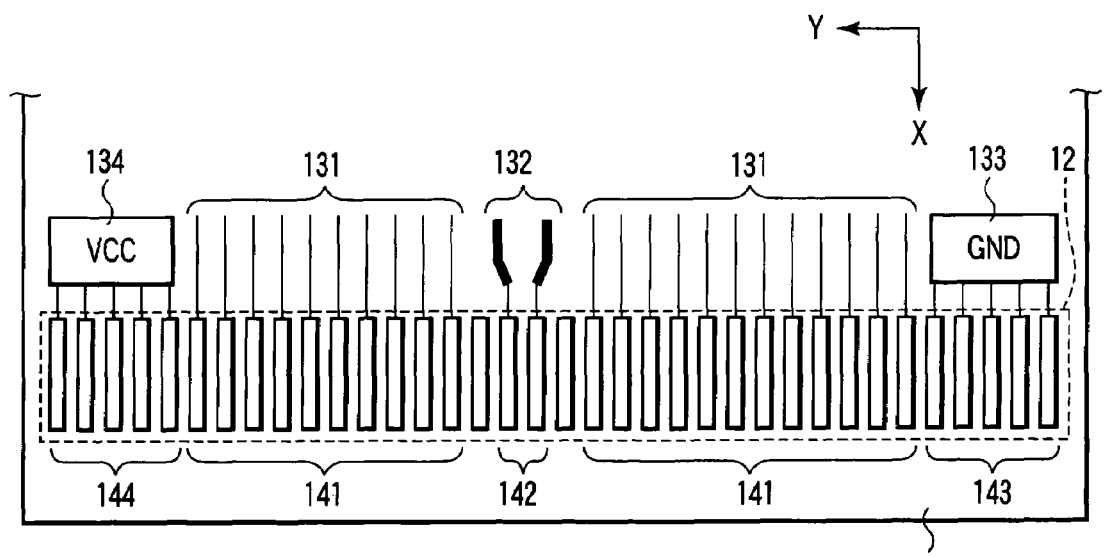
F I G. 6

CIRCUIT BOARD HAVING SIGNAL LINES ADAPTED TO TRANSMIT HIGH SPEED SIGNALS

CROSS-REFERENCE TO RELATED APPLICATIONS

This application is based upon and claims the benefit of priority from the prior Japanese Patent Application No. 2004-347157, filed Nov. 30, 2004, the entire contents of which are incorporated herein by reference.

BACKGROUND

1. Field

The present invention relates to a circuit board and more particularly to a circuit board on which signal lines adapted to transmit high-speed signals are placed.

2. Description of the Related Art

In recent years, anisotropic conductive film (ACF) interconnection technique has attracted attention as a technique to interconnect circuit boards, such as printed wiring boards (PWB) or flexible printed circuit boards (FPCB).

ACF interconnection technique is one in which the joints of circuit boards are compression-bounded together through an ACF, which is an anisotropic conductive material. The anisotropic conductive material is electrically conductive in the direction of thickness of the joint and nonconductive in the direction of plane of the joint. Such a property of the anisotropic conductive film allows the ACF interconnection technique to be suitable for interconnection of circuit boards that contain fine interconnect lines. For this reason, the ACF interconnection technique has been frequently used in interconnecting a display panel and its associated peripheral portion.

Japanese Unexamined Patent Publication No. 2003-216064 discloses an electro-optical device in which a display board serving as a display panel is connected to a junction board, such as an FPCB, through the ACF interconnection technique.

Recently, in information-processing devices such as personal computers, the use of a high-speed signal interface adapted to transmit signals higher in speed than display signals has begun. For this reason, not only signal lines for transmitting normal-speed signals but also signal lines adapted to transit high-speed signals are placed on circuit boards.

The circuit boards that contain such high-speed signal lines need to provide stringent impedance matching and make provisions for high-frequency noise.

However, the conventional ACF joints allow for interconnection of circuit boards which contain fine interconnect lines but not interconnection of circuit boards which contain high-speed signal lines.

BRIEF DESCRIPTION OF THE SEVERAL VIEWS OF THE DRAWING

FIG. 4 is a sectional view illustrating the structure of joints after compression bonding of the circuit boards shown in FIG. 2;

FIG. 5 shows a first example of an electrode arrangement of the joint of the circuit board of FIG. 1;

FIG. 6 shows a normal electrode arrangement of the joint;

DETAILED DESCRIPTION

The embodiments of the present invention will be described hereinafter with reference to the accompanying drawings.

First, the structure of a circuit board according to an embodiment of the present invention will be described with reference to FIG. 1 and FIG. 2. The circuit board is implemented in the form of a printed wiring board (PWB) 11. The PWB 11 is configured so that it can be bonded to another circuit board. In the description which follows, it is assumed that the PWB 11 is connected to a flexible printed wiring board (FPC) 21.

Figure 1:
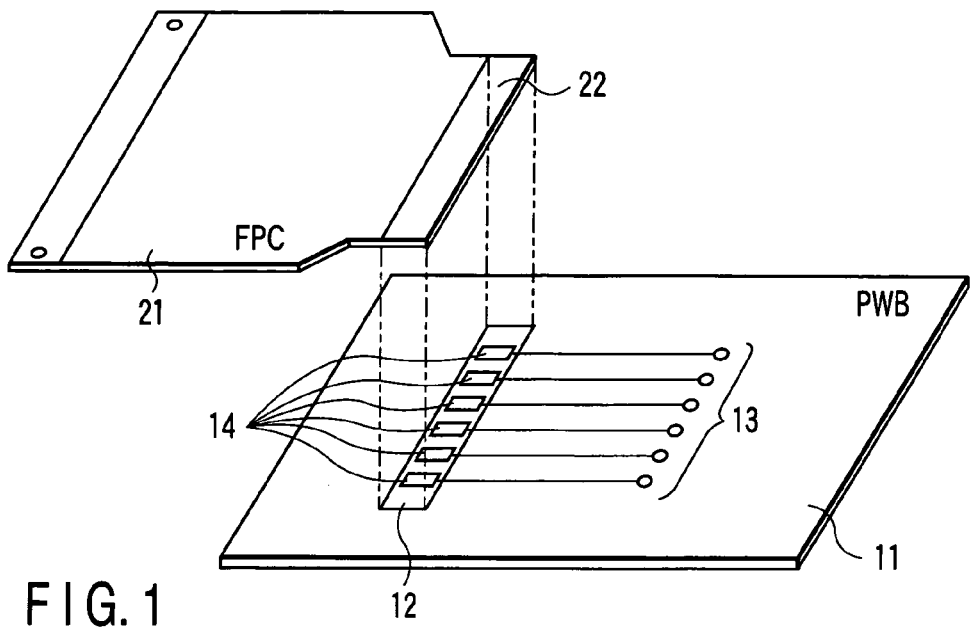
FIG. 1 is a perspective view illustrating the structure of a circuit board according to an embodiment of the present invention.

FIG. 1 is an exploded perspective view illustrating the state where the printed wiring board 11 and the flexible printed wiring board 21 are separated from each other. FIG. 2 is a perspective view illustrating the state where the printed wiring board 11 and the flexible printed wiring board 21 are connected together.

The printed wiring board 11 is a rigid circuit board on which various electronic circuit components are mounted. This printed wiring board 11 is used as a circuit board on which a device having an interface that meets, for example, the PCI EXPRESS standard is to be mounted. A plurality of signal lines 13 is arranged on the surface of the printed wiring board 11. These signal lines 13 include signal lines for transmitting normal—speed signals and signal lines adapted to transmit high-speed signals such as PCI EPRESS compatible signals. The surface of the printed wiring board 11 is coated with an insulating protective film. Each of the signal lines 13 is also coated with the same type of protective film.

Each of the signal lines 13 has its one end connected to a via plug (also called a through plug) formed in the printed wiring board 11 and its other end connected to an ACF joint 12 provided on the surface of the printed wiring board 11. The ACF joint 12 is a joint to be bonded to another circuit board by means of the ACF interconnection technique.

In this embodiment, the ACF joint 12 on the printed wiring board 11 is bonded to an ACF joint 22 of the flexible printed wiring board 21 through an anisotropic conductive material. The ACF joint 12 is formed on top with a plurality of electrodes (which may be called connecting terminals or plugs) 14. Each of the electrodes 14 is connected to a respective one of the signal lines 13. The surface of each of the electrodes 14 is exposed.

The ACF joint 22 of the flexible printed wiring board 21 is also formed underneath with a plurality of electrodes.

Figure 2:
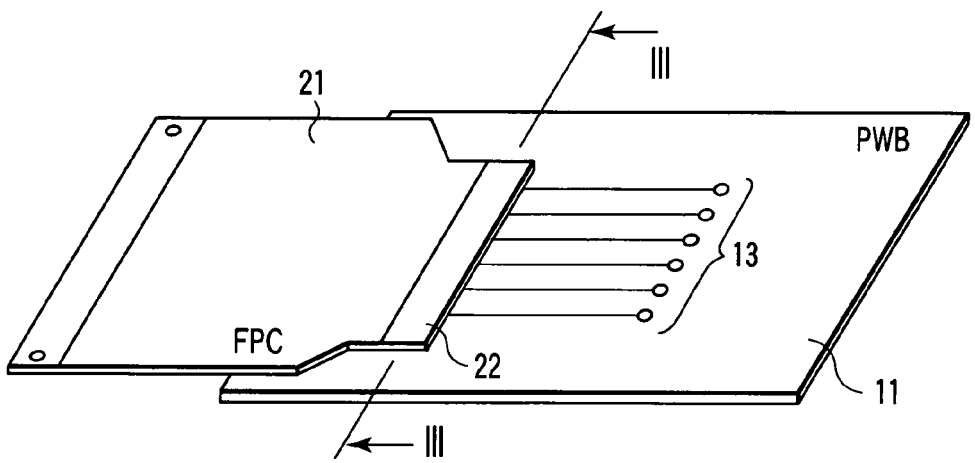
FIG. 2 is a perspective view illustrating the state in which another circuit board is connected to the circuit board of FIG. 1.
Figure 3:
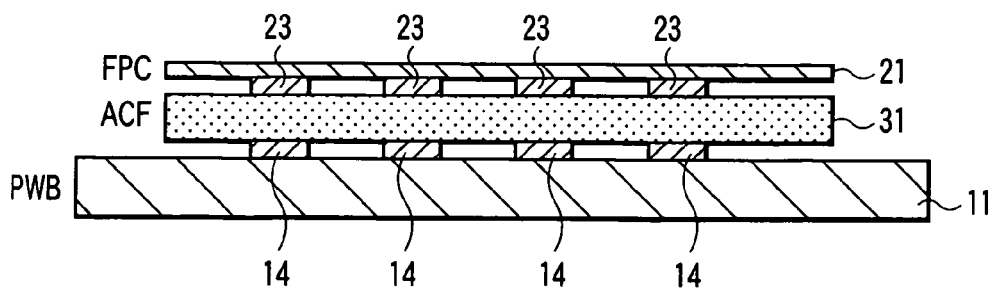
FIG. 3 is a sectional view illustrating the structure of joints before compression bonding of the circuit boards shown in FIG. 2.

FIG. 3 and FIG. 4 are sectional views taken along line III-III of FIG. 2. FIG. 3 shows the state before compression bonding and FIG. 4 shows the state after compression bonding.

On the surface of the ACF joint 12 is placed an ACF (high-polymer anisotropic conductive film) 31 of the same shape as the ACF joint 12. The entire surface of the ACF joint 12 and the entire surface of the ACF joint 22 are bonded together with the ACF 31 interposed therebetween by means of, say, thermocompression bonding. In this way, each of the electrodes 14 of the ACF joint 12 is compression bonded to a corresponding one of the electrodes 23 of the ACF joint 22 through the anisotropic conductive film.

The ACF 31 is an anisotropic conductive material having adhesive, conductive and insulating properties. The anisotropic conductive material is electrically conductive in the direction of thickness of the joints, i.e., in the direction of compression, and electrically insulative in the direction of plane of the joints. Therefore, bonding the ACF joint 12 of the printed wiring board 11 and the ACF joint 22 of the flexible printed wiring board 21 together with the ACF 31 interposed therebetween allows each of the electrodes 14 of the ACF joint 12 and a corresponding one of the electrodes 23 of the ACF joint 22 to be electrically connected together while electric insulation between adjacent electrodes 14 and between adjacent electrodes 23 is maintained.

FIG. 5 shows a relationship between the signal lines on the printed wiring board 11 and the electrodes of the ACF joint 12.

In FIG. 5, a reference number 131 denotes normal signal lines formed on the printed wiring board 11 and a reference number 132 denotes high-speed signal lines formed on the board 11. Moreover, a reference number 133 denotes a power supply (ground side) pattern formed on the board 11 and a reference number 134 denotes a power supply (plus side VCC) pattern formed on the board 11.

The normal signal lines 131 and the high-speed signal lines 132 are all made to extend in the X direction. The width and spacing of the high-speed signal lines 132 are made to differ from those of the normal signal lines 131 in order to achieve a set characteristic impedance. Specifically, the normal signal lines 131 are made relatively small in width. The high-speed signal lines 132 are made larger in width than the normal signal lines 131. The pitch of the high-speed signal lines 132 is made larger than that of the normal signal lines 131. That is, the normal signal lines 131 are arranged along the Y direction with a relatively small spacing. The high-speed signal lines 132 are arranged along the Y direction with a larger spacing than the normal signal lines 131.

The high-speed signal lines 132 are configured to a pair of differential signal lines, for example. Naturally, a plurality of differential signal line pairs may be provided as the high-speed signal lines 132. Alternatively, a plurality of single-ended signal lines may be provided as the high-speed signal lines 132.

The ground pattern (ground side power supply line) 133 and the VCC pattern (plus side VCC power supply line) 134 are each designed to have a sufficiently large width in comparison with the signal lines 131 and the signal lines 132 in order to ensure a sufficient power source capacity.

The ACF joint 12 is formed with electrodes 141 of a nearly rectangular shape and electrodes 142 of a nearly rectangular shape. Each of the electrodes 141 is connected to a respective one of the normal signal lines 131. Each of the electrodes 142 is connected to a respective one of the high-speed signal lines 132. The direction of the length of the electrodes 141 and 142 coincides with the X direction.

The electrodes 141 are arranged along the Y direction at regularly spaced intervals. The width of each of the electrodes 141 is relatively small. The width (in the Y direction) and spacing of the electrodes 142 are set larger than those of the electrodes 142 so as to match the width and spacing of the high-speed signal lines 132. That is, the electrodes 142 are arranged along the Y direction with spacing larger than that of the electrodes 141. The width of the electrodes 142 is set equal to or larger than the width of the high-speed signal lines 132. Thus, in the ACF joint 12 as well, the set characteristic impedance of the high-speed signal lines 132 can be held as it is.

The ACF joint 12 is formed with an electrode 143 connected to the ground pattern 133 and an electrode 144 connected to the VCC pattern 134. The electrode 143 has the same width as the ground pattern 133. Likewise, the electrode 144 has the same width as the VCC pattern 134. Thereby, the connection resistance in the ACF joint 12 can be reduced, thus allowing a sufficient power source capacity to be ensured.

The ACF joint 22 of the flexible wiring board 21 also has the same electrode arrangement as the ACF joint 12 of the printed wiring board 11.

Figure 7:
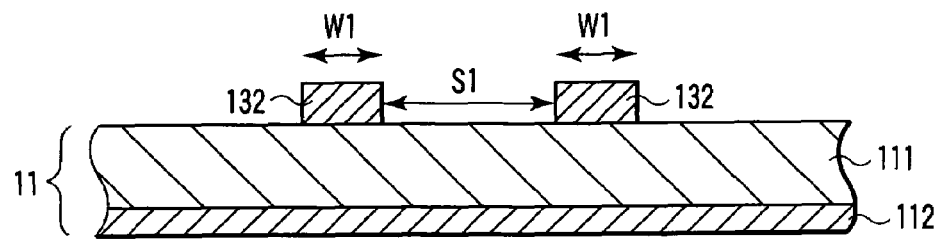
FIG. 7 shows the sectional structure of the high-speed signal lines formed on the circuit board of FIG. 1.
Figure 8:
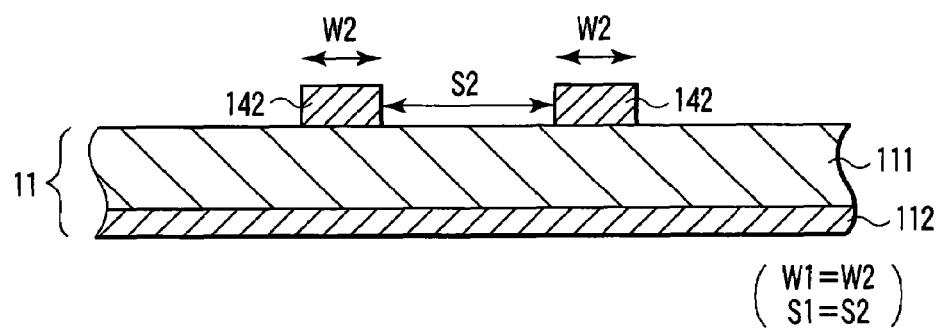
FIG. 8 shows the sectional structure of the electrodes formed in the joint on the circuit board of FIG. 1.

Reference is now made to FIG. 7 and FIG. 8 to describe a relationship between the width and spacing of the electrodes 142 and the width and spacing of the high-speed signal lines 132.

FIG. 7 shows the sectional structure of the high-speed signal lines 132. The printed wiring board 11 includes a ground layer 112 and a dielectric layer 111 formed on the top of the ground layer. The signal lines are formed on the dielectric layer 111. The characteristic impedance (differential impedance) of the high-speed signal lines 132 forming a differential signal line pair is determined by the width $W1$ and spacing $S1$ of the two high-speed signal lines 132 and the thickness and permittivity of the dielectric layer 111. In other words, the width $W1$ and spacing $S1$ of the paired high-speed signal lines 132 are designed so that the set characteristic impedance is obtained.

FIG. 8 shows the sectional structure of the electrodes 142 connected to the high-speed signal lines 132. In this embodiment, the width $W2$ and spacing $S2$ of the electrodes 142 are set equal to the width $W1$ and spacing $S1$, respectively, of the paired high-speed signal lines 132. Thereby, in the ACF joint 12 as well, the width $W1$ and spacing $S1$ of the paired high-speed signal lines 132 required to achieve the set characteristic impedance can be maintained.

If, as shown in FIG. 6, the width and spacing of electrodes 142, 143 and 144 were set equal to the width and spacing, respectively, of the electrodes 141 connected to the normal signal lines 131, the width of the high-speed signal lines 132 would have to be made small in the vicinity of the ACF joint 12. Under this circumstance, the set characteristic impedance could not be maintained.

In addition, each of the ground pattern 133 and the VCC pattern 134 would have to be divided into two or more electrodes in order to ensure power source capacity. Under this circumstance, however, it would be difficult to fully reduce the connection resistance.

Thus, the use of the electrode arrangement of FIG. 5 allows transmission of high-speed signals to or from another circuit board to be carried out efficiently through the ACF joints.

Figure 9:
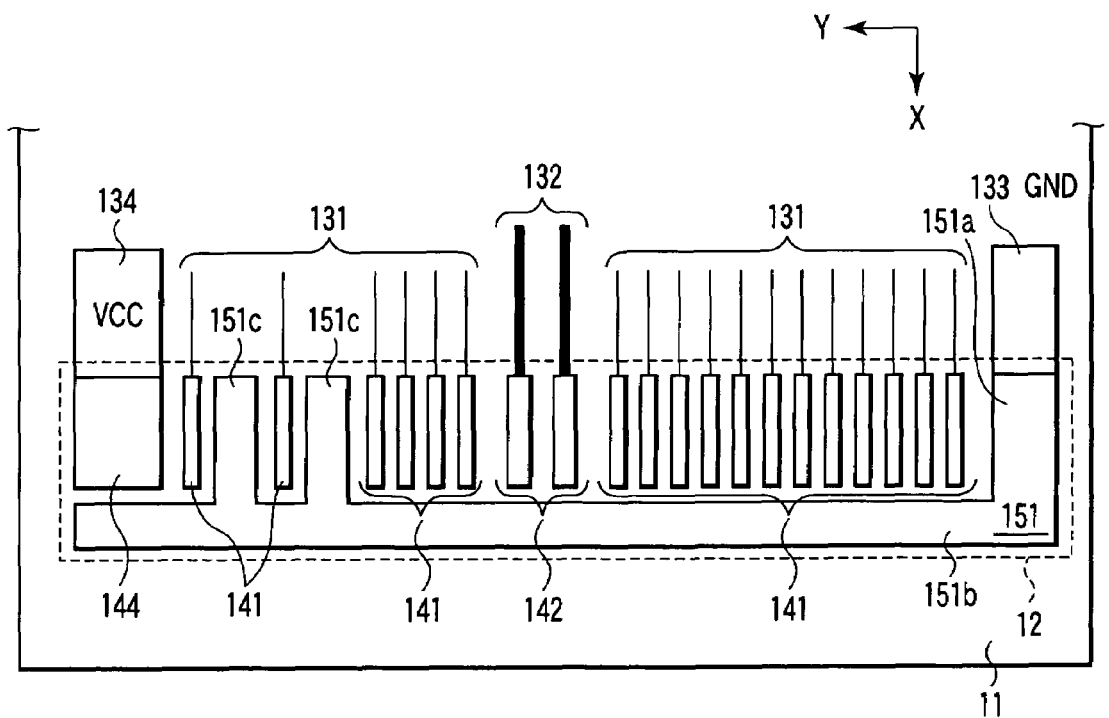
FIG. 9 shows a second example of an electrode arrangement of the joint of the circuit board of FIG. 1.

FIG. 9 shows a second example of an electrode arrangement in the ACF joint 12.

Hereinafter, the portions of this electrode arrangement which differ from the arrangement of FIG. 5 will be described mainly.

The ACF joint 12 is provided with a ground electrode 151 connected to the ground pattern 133. The ground electrode 151 is composed of an electrode portion 151a, an electrode portion 151b, and two electrode portions 151c. The electrode portion 151a is connected to the ground pattern 133 and extends in the X direction from the point of connection to the ground pattern 133. The electrode portion 151b extends in the Y direction to face the electrodes 141 and 142. Each of the electrode portions 151c extends in the Y direction and is inserted between two specific adjacent electrodes of the electrodes 141 and 142 at a predetermined distance apart therefrom.

The ACF joint 22 of the flexible wiring board 21 has also the same electrode arrangement as shown in FIG. 9.

The entire surface of the ACF joint 12 is bonded to the ACF joint 22 of the flexible wiring board 21 by an ACF.

The ground electrode 151, which functions as a shielding member, allows the leakage of high-frequency noise from the ACF joint 12 to be prevented. The electrode portions 151c function as a guard pattern to allow for electrical isolation between two adjacent electrodes, thus allowing crosstalk noise between the two electrodes to be reduced. The electrodes 151c may be provided by the number of electrode pairs for which the generation of crosstalk noise is to be prevented.

Thus, the use of the electrode arrangement shown in FIG. 9 allows the transmission of high-frequency signals to or from another circuit board to be carried out efficiently through the ACF joints.

Figure 10:
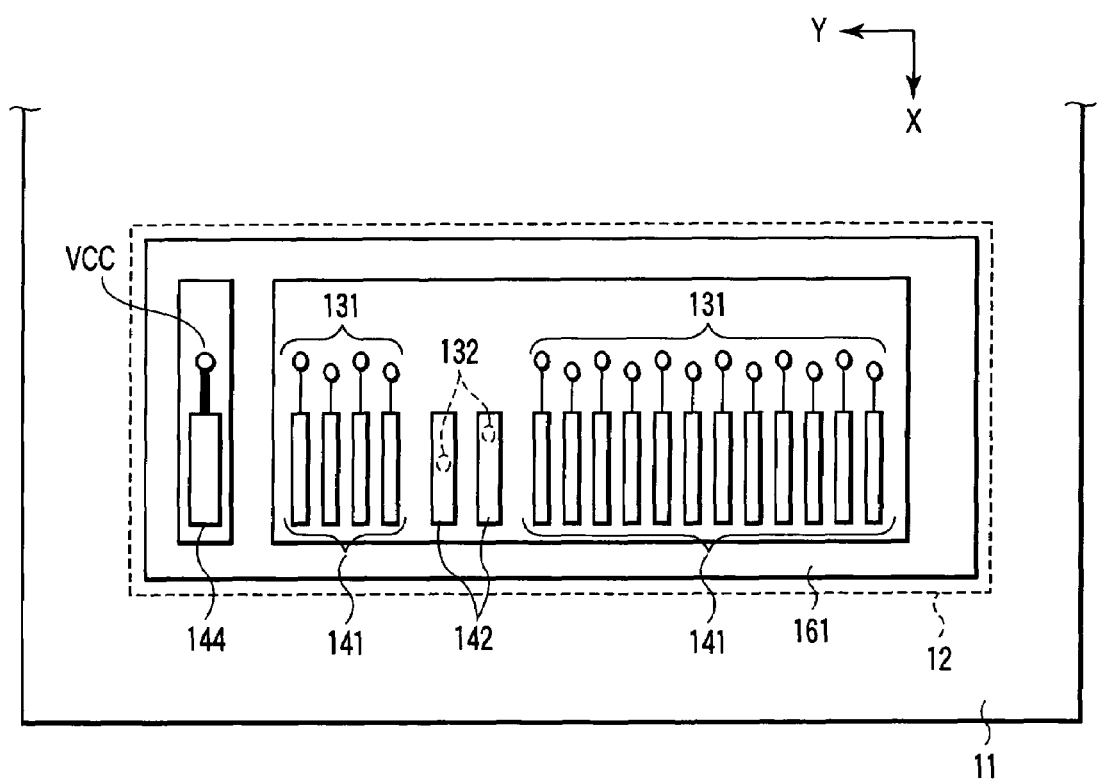
FIG. 10 shows a third example of an electrode arrangement of the joint of the circuit board of FIG. 1.

FIG. 10 shows a third example of an electrode arrangement in the ACF joint 12.

Hereinafter, the portions of this electrode arrangement which differ from the arrangement of FIG. 5 will be described mainly.

The ACF joint 12 is provided with a ground electrode 161, which is formed in the shape of a ring to surround the electrodes 141, the electrodes 142 and the signal lines 131 and the signal lines 132. In FIG. 10, the ground electrode 161 has two apertures. The electrodes 141, the electrodes 142, the signal lines 131 and the signal lines 132 are placed within one of the apertures, while the power supply line VCC and the electrode 144 are placed within the other aperture.

In the ACF joint 12, each electrode is exposed to the outside and the other portion is coated with an insulating film (protective film).

The ACF joint 22 of the flexible wiring board 21 has the same electrode arrangement as shown in FIG. 10.

The entire surface of the ACF joint 12 is bonded to the ACF joint 22 of the flexible wiring board 21 by an ACF.

Thus, by surrounding the signal lines and the electrodes with the ground electrode 161, the shield effect can be increased and the leakage of high-frequency noise can be greatly decreased. The normal signal lines 131 are connected through via holes formed in the ACF joint 12 to wiring layers of the printed wiring board 11 formed from a multilevel wiring board. The high-speed signal lines 132 are connected through via holes (pads on vias) formed on the electrodes 142 to other wiring layers of the printed wiring board 11. Naturally, it is also possible to use pads on vias for the high-speed signal lines 132. Further, it is also possible to use via holes formed in the ACF joint 12 for the high-speed signal lines 132. The ground electrode 161 is also connected to the ground plane formed in the wiring layers of the printed wiring board 11 through a pad on via, for example.

According to the embodiment, a circuit board formed with high-speed signal lines that require rigid impedance matching and provisions for high-frequency noise can be readily connected to another circuit board through the use of ACF interconnection technique and high-speed signals can be transferred between the circuit boards.

Although in this embodiment the width in the Y direction of the electrodes 142 is set larger than that of the electrodes 141, this is not restrictive. For example, when the high-speed signal lines 132 are equal in width to the normal signal lines 131, the electrodes 142 may be set equal in width to the electrodes 141. In this case as well, by setting the spacing of the electrodes 142 larger than that of the electrodes 141, impedance matching and electrical isolation between the high-speed signal lines 132 can be provided.

In addition, an ACP (anisotropic conductive paste) which is an anisotropic conductive material in paste form may be used in place of an ACF.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A circuit board comprising:
   a plurality of first signal lines configured to transmit first signals;
   a plurality of second signal lines configured to transmit second signals which are higher in speed than the first signals;
   a joint configured to be bonded to a joint of another circuit board through an anisotropic conductive material;
   a plurality of first electrodes arranged at regular intervals separated by a first distance in the joint, each of the first electrodes being connected to a respective one of the first signal lines; and
   a plurality of second electrodes arranged at regular intervals separated by a second distance larger than the first distance in the joint, each of the second electrodes being connected to a respective one of the second signal lines.

2. The circuit board according to claim 1, wherein each of the first electrodes has a first width and each of the second electrodes has a second width larger than the first width.

3. The circuit board according to claim 2, wherein the second width is equal to the width of each of the second signal lines and the second distance is equal to the spacing of the second signal lines.

4. The circuit board according to claim 1, wherein the second distance is equal to the spacing of the second signal lines.

5. The circuit board according to claim 1, wherein the second signal lines includes at least one pair of differential signal lines.

6. The circuit board according to claim 1, wherein each of the second signal lines is comprised of a single ended line.

7. The circuit board according to claim 1, further comprising a power supply line and a third electrode which is formed in the joint, has the same width as the power supply line, and is connected to the power supply line.

8. The circuit board according to claim 1, wherein the first and second electrodes are arranged along a predetermined direction and further comprises a ground electrode which faces the first and second electrodes and extends in the predetermined direction.

9. The circuit board according to claim 8, wherein the ground electrode includes a first electrode portion which faces the first and second electrodes and extends in the predetermined direction and a second electrode portion which extends in a direction perpendicular to the predetermined direction and is inserted between two specific adjacent electrodes of the first and second electrodes at a predetermined distance apart therefrom.

10. The circuit board according to claim 1, further comprising a ground electrode formed in the joint to have a ring shape to surround the first and second electrodes.

11. A circuit board comprising:
a plurality of first signal lines configured to transmit first signals;
a plurality of second signal lines configured to transmit second signals which are higher in speed than the first signals;
a joint configured to be bonded to a joint of another circuit board through an anisotropic conductive material;
a plurality of first electrodes formed in the joint each of which is connected to a respective one of the first signal lines;
a plurality of second electrodes formed in the joint each of which is connected to a respective one of the second signal lines; and
a ground electrode formed in the joint to have a ring shape to surround the first and second electrodes.

* * * * *